(12) United States Patent
Murphy et al.

(10) Patent No.: US 12,287,369 B1
(45) Date of Patent: Apr. 29, 2025

(54) SELF-CORRECTING CIRCUITRY

(71) Applicant: Cadence Design Systems, Inc., San Jose, CA (US)

(72) Inventors: Patrick Murphy, Cork (IE); Cornelius O'Shea, Cork (IE); Joe Canning, Cork (IE); Dariusz Piotr Palubiak, Cork (IE); Vitali Karasenko, Cork (IE)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 18/364,064

(22) Filed: Aug. 2, 2023

(51) Int. Cl.
 *G01R 31/3185* (2006.01)
(52) U.S. Cl.
 CPC ......... *G01R 31/318525* (2013.01); *G01R 31/318572* (2013.01)
(58) Field of Classification Search
 CPC ......... G01R 31/318525; G01R 31/318572
 See application file for complete search history.

(56) References Cited

U.S. PATENT DOCUMENTS

| 2017/0117895 A1* | 4/2017 | Clark | H03K 19/0963 |
| 2022/0076718 A1* | 3/2022 | Schrape | G11C 7/106 |

OTHER PUBLICATIONS

Aibin Yan, "Parallel DICE Cells and Dual-Level CEs based 3-Node-Upset Tolerant Latch Design for Highly Robust Computing," 2021 IEEE International Test Conference in Asia (ITC-Asia), Year: 2021 | Conference Paper | Publisher: IEEE.
Hui Xu, "Design of a Highly Robust Triple-Node-Upset Self-Recoverable Latch," IEEE Access Year: 2021 | vol. 9 | Journal Article | Publisher: IEEE.
Lawrence T. Clark, "Self-correcting Flip-flops for Triple Modular Redundant Logic in a 12-nm Technology," 2022 IEEE International Symposium on Circuits and Systems (ISCAS), Year: 2022 | Conference Paper | Publisher: IEEE.
Liu et al., "A Polarity-Driven Radiation-Hardened Latch design for Single Event Upset Tolerance," 2022 IEEE International Symposium on Defect and Fault Tolerance in VLSI and Nanotechnology Systems.
David Rennie, "Performance, Metastability, and Soft-Error Robustness Trade-offs for Flip-Flops in 40 nm CMOS," IEEE Transactions on Circuits and Systems I: Regular Papers Year: 2012 | vol. 59, Issue: 8 | Journal Article | Publisher: IEEE.
Schrape et al., "Design and Evaluation of Radiation-Hardened Standard Cell Flip-Flops," IEEE Transactions on Circuits and Systems I: Regular Papers Year: 2021 | vol. 68, Issue: 11 | Journal Article | Publisher: IEEE.
Shuo Cai, "A Low-Cost Quadruple-Node-Upset Self-Recoverable Latch Design," 2021 IEEE International Test Conference in Asia (ITC-Asia) Year: 2021 | Conference Paper | Publisher: IEEE.
Albin Yan et al., "A Sextuple Cross-Coupled Dual-Interlocked-Storage Cell Based Multiple-Node-Upset Self-Recoverable Latch," 2021 IEEE International Symposium on Nanoscale Architectures (NANOARCH), Year: 2021 | NANOARCH53687.2021.9642250.

* cited by examiner

*Primary Examiner* — Thien Nguyen
(74) *Attorney, Agent, or Firm* — Mark H. Whittenberger; Holland & Knight LLP

(57) ABSTRACT

Embodiments include herein are directed towards various circuit topologies. A self-correcting latch circuit may include a plurality of memory loops, a plurality of clock inputs, a plurality of data inputs, and a plurality of outputs. Each of the plurality of memory loops may be configured to store data in parallel.

18 Claims, 8 Drawing Sheets

500

600

SELF-CORRECTING CIRCUITRY

FIELD OF THE INVENTION

The present disclosure relates to circuits and, more particularly, to circuits including self-correcting flip-flops.

BACKGROUND

Existing latches or flip-flops can store an error after a single event transient fault (SET), a single event upset (SEU) or multiple event upsets (MEU). With advances in smaller complementry metal-oxide semiconductor (CMOS) technologies, there has been an increase in the susceptibility of integrated circuits (ICs) to SEU which may be caused by external radiation. These event upsets are more important in the storage nodes of a latch or flip-flop, as the error is stored and could cause an error when later read. This is in contrast to combinational logic where an error disturbance is not stored, and the logic will return to its original state.

One conventional approach for improving a design to MEU is to implement triple mode redundancy (TMR) on all flip-flops in a design. This increases the sequential cell area by a factor of approximately four. A weakness of TMR is that if two out of the three flip-flop outputs are corrupted at any time, then the output may be incorrect and may cause a failure because of the errors that are stored in the flip-flops. For example, if a mode configuration register of a device is set once after power up and needs to retain this mode setting for a long period of time, two separate error events over time may corrupt the TMR voted output of the flip-flop set.

SUMMARY

In one or more embodiments of the present disclosure, a circuit is provided. The circuit may include a self-correcting latch circuit. The self-correcting latch circuit may include a plurality of memory loops, a plurality of clock inputs, a plurality of data inputs, and a plurality of outputs, wherein each of the plurality of memory loops is configured to store data in parallel.

One or more of the following features may be included. In some embodiments, the self-correcting latch circuit may include a plurality of resets. The self-correcting latch circuit may include a plurality of sets. A single input may be connected to each of the plurality of data inputs. A second latch circuit may be configured to generate a self-correcting flip-flop circuit wherein the first latch and second latch are a master latch and a slave latch. The self-correcting circuit may include voting logic configured to receive the plurality of outputs to reject any error in the plurality of memory loops. The plurality of memory loops may include at least one Muller C element. Each of the plurality of memory loops may be spaced apart by a predetermined distance. The plurality of memory loops, the plurality of clock inputs, the plurality of data inputs, and the plurality of outputs may all be greater than or equal to two. The plurality of memory loops, the plurality of clock inputs, the plurality of data inputs, and the plurality of outputs may all be equal to three. The plurality of clock inputs and the plurality of resets may be equal to three.

In one or more embodiments of the present disclosure, a circuit is provided. The circuit may include a self-correcting circuit including a master latch circuit and a slave latch circuit. The self-correcting circuit may include a plurality of memory loops, a plurality of clock inputs, a plurality of data inputs, a plurality of outputs, a plurality of resets, and a plurality of sets, wherein each of the plurality of memory loops is configured to store the same data in parallel.

One or more of the following features may be included. In some embodiments, the plurality of memory loops may include three memory loops. A single input may be connected to each of the plurality of data inputs. A second latch circuit may be configured to generate a self-correcting flip-flop circuit wherein the first latch and the second latch are a master latch and a slave latch. The self-correcting circuit may include voting logic configured to receive the plurality of outputs to reject any error in the plurality of memory loops. The plurality of memory loops may include at least one Muller C element. Each of the plurality of memory loops may be spaced apart by a predetermined distance. The plurality of memory loops, the plurality of clock inputs, the plurality of data inputs, and the plurality of outputs may all be greater than or equal to two. The plurality of clock inputs, the plurality of data inputs, and the plurality of outputs may all be equal to three.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
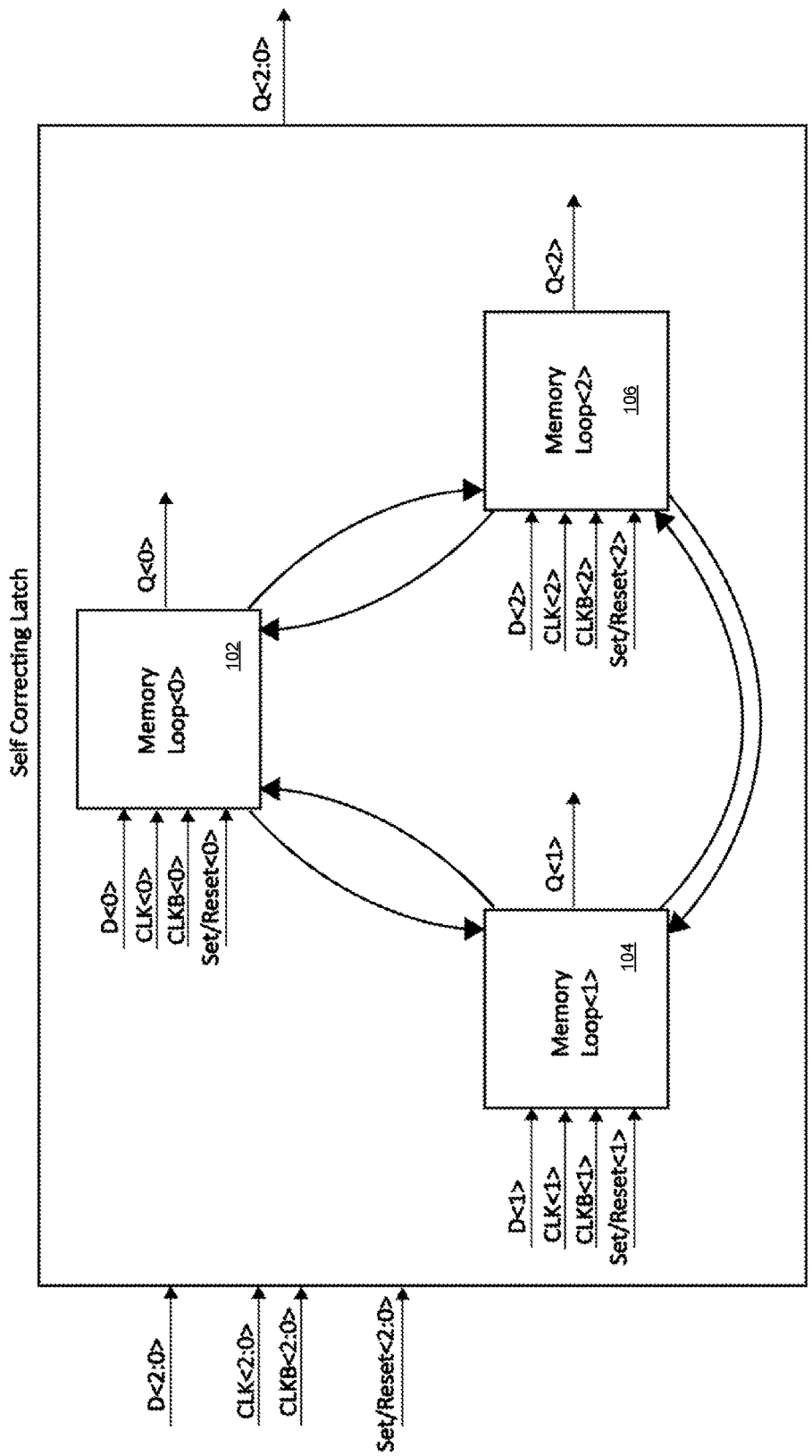
FIG. 1 shows an example latch circuit in accordance with embodiments of the present disclosure.

Embodiments of the present disclosure are directed towards a low area, low power self-correcting latch and/or flip-flop with multiple (N) interleaved memory loops using Muller C elements to improve tolerance to MEU, with multiple (N) clock inputs, multiple (N) resets/sets, and voting logic at the output to reject any error in the individual memory loop. In some embodiments, the multiple clocks and resets/sets may be connected independently to each interleaved memory loop in the self-correcting latch/flip-flop to remove any error that may be caused by an error on a single clock or set/reset input.

As used in any embodiment described herein, "interleaved memory loop" describes memory loops that include Muller C element logic and clock gated Muller C elements. In the case of one memory loop, it has inputs and outputs connected to and from the other memory loops in the latch, to create comparison feedback logic that ensures errors are rejected if different from whats expected. This interleaving of inputs and outputs from other memory loops is described as an "interleaved memory loop".

As used in any embodiment described herein, "circuit" or "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring to FIG. 1, there is shown an implementation of a latch circuit 100. In this particular example, three memory loops 102, 104 and 106 are shown within latch circuit 100, which may include three inputs, three outputs, three clock inputs and three set/resets inputs.

Figure 2:
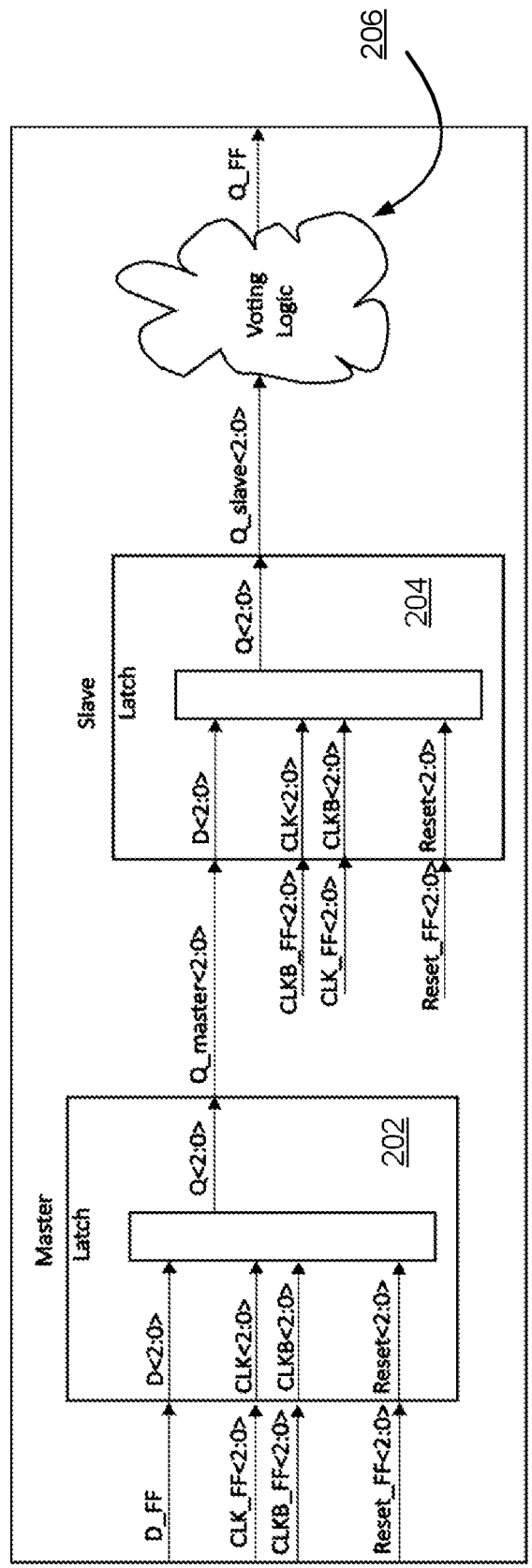
FIG. 2 shows an example master slave flip-flop circuit in accordance with embodiments of the present disclosure.

Referring to FIG. 2, there is shown an implementation of a latch circuit in a master/slave flip flop circuit 200. In this particular example, master latch circuit 202 and slave latch circuit 204 are shown within master/slave flip-flop circuit 200, which may include an asynchronous reset with single input, single output, three clock/set/resets and voting logic circuit 106.

In some embodiments, the voting logic circuit 206 can be constructed by the use of four cells, of which three are 2 input AND cells, and a single 3 input OR cell. This logic results in the output rejecting any single error on the 3 inputs, where the output follows 2 out of the 3 inputs.

Figure 3:
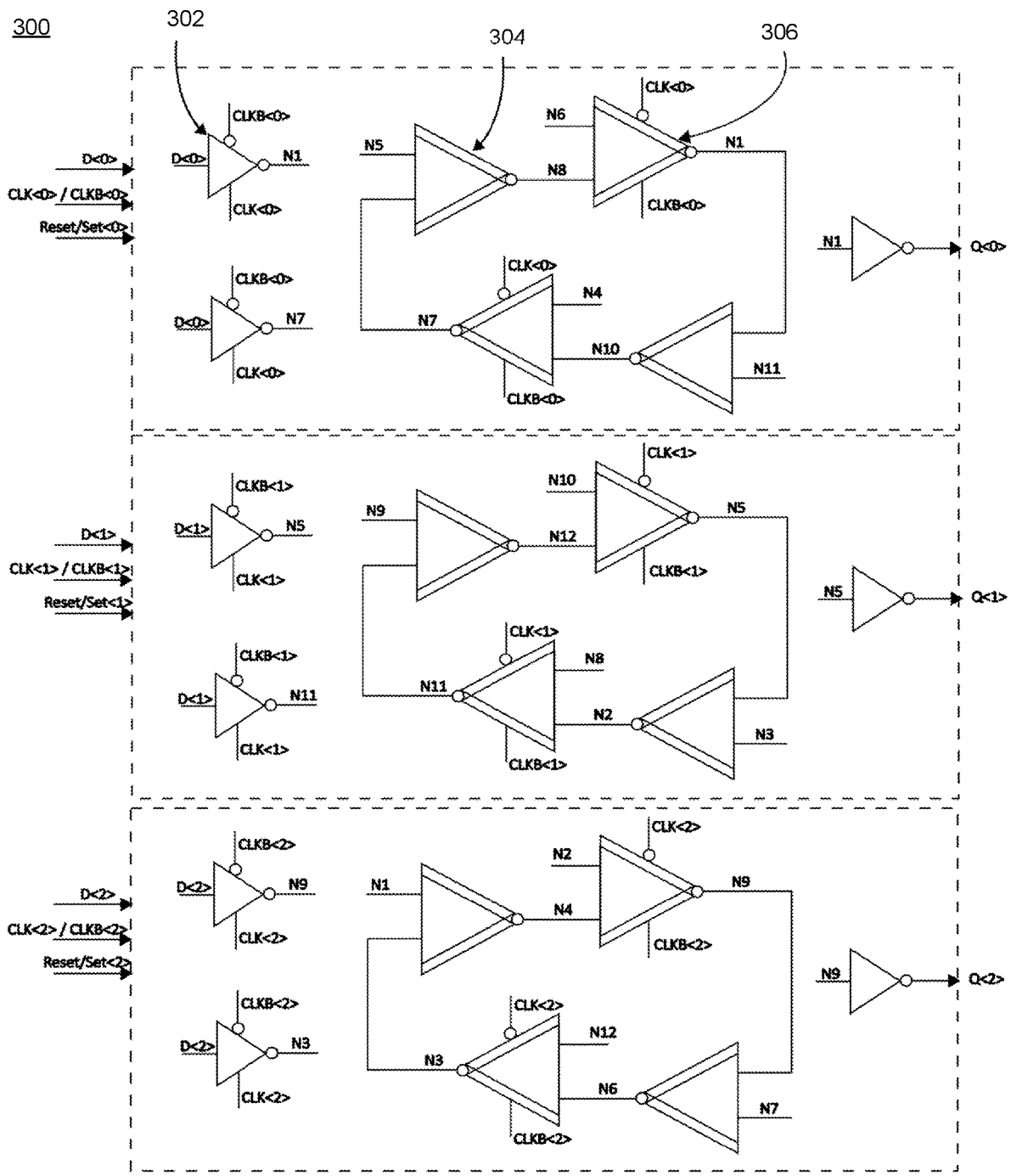
FIG. 3 shows an example self-correcting circuit in accordance with embodiments of the present disclosure.

In some embodiments, N may be equal to 3. Voting logic 206 may operate best when using an odd value for N, to remove biases where there is a 50/50 vote. Here, the three outputs may be combined to one output "Q_FF", wherein voting logic 106 may be configured to ignore any errors. The latch circuit may have a high level of resilience to SEU as shown in FIG. 3. If high amplitude MEU were applied to the master/slave flip-flop, an error needs to occur on two of the three memory loop output signals (N1, N5 or N9) at exactly the same time for the output Q_FF to directly produce an error. If a MEU occurs on internal nodes of the memory loops, the Muller C elements and interleaved memory loops ensure there is a high immunity to MEU and an error will not occur at the output of each memory loop. The self-correcting nature of the latch in this embodiment may recover the output to the correct state and any error is not stored.

In some embodiments, and as shown in FIG. 2, the circuit may include a single bit flip-flop, as a single input "D_FF" may be connected to the three inputs of the master latch (D<2:0>), which may result in the same data being stored in the three memory loops of the latch circuit in parallel. There may be three connections from the output of the master latch (Q_master<2:0>) to the data input of the slave latch (D<2:0>), and from the output of the slave latch (Q_slave<2:0>) onto the voting logic 106, which outputs the single output Q_FF.

Referring again to FIG. 3, a diagram 300 showing a latch implementation consistent with embodiments of the present disclosure is provided. FIG. 3 includes clock gated inverter 302, Muller C element 304, and clock gated Muller C element 306. This particular example depicts a self-correcting latch circuit having three inputs/outputs/clocks/sets-resets. Here, the latch circuitry is shown having data input (D<2:0>), clock inputs (CLK<2:0>) and inverted clock inputs (CLKB<2:0>), Reset (Reset<2:0>) or Set inputs (Set<2:0>) and the latch outputs (Q<2:0>).

Figure 4:
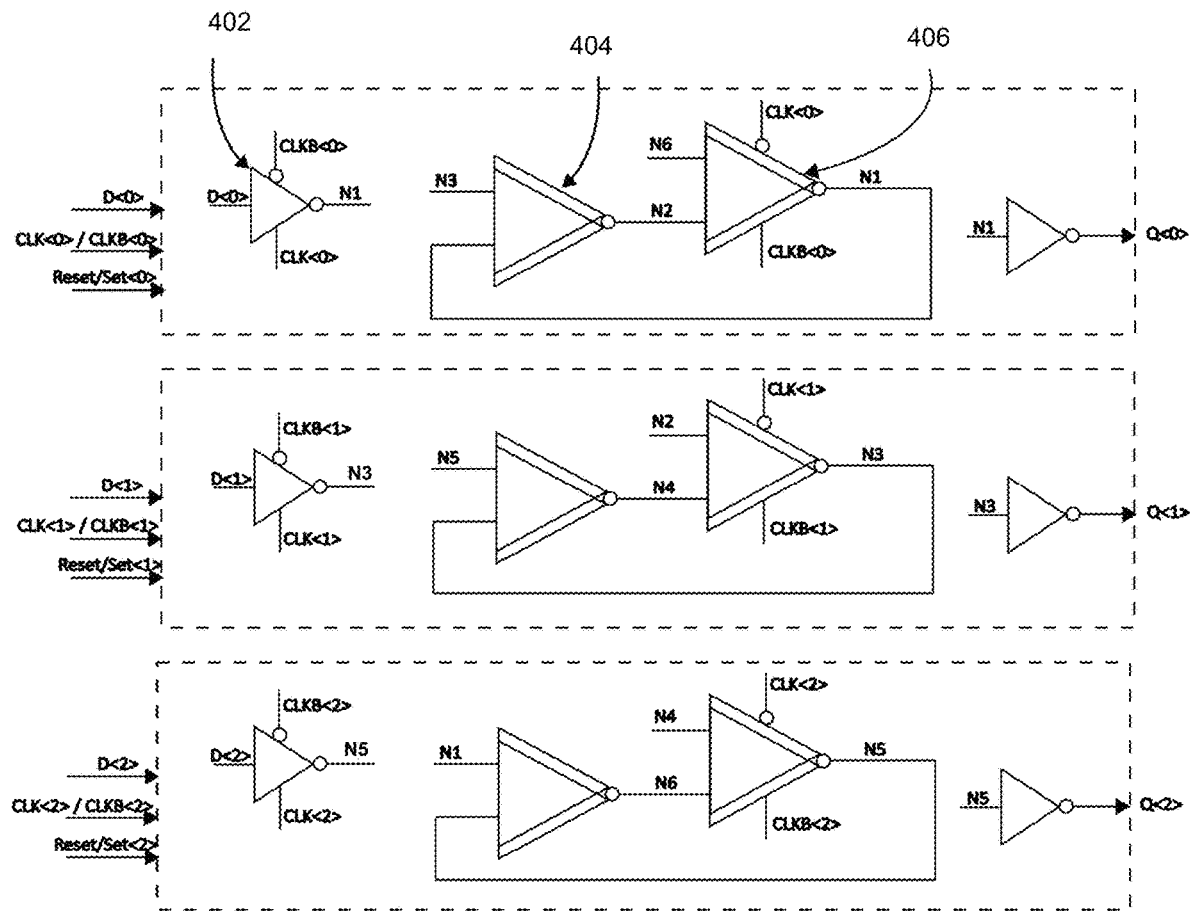
FIG. 4 shows another example self-correcting circuit in accordance with embodiments of the present disclosure.

Referring now to FIG. 4, an embodiment showing a smaller area self-correcting latch circuit having three inputs/outputs/clocks/sets-resets is provided. FIG. 4 includes clock gated inverter 402, Muller C element 404, and clock gated Muller C element 406. This particular latch circuit may not be as resilient to rejecting MEU's as in FIG. 3, however it does have the advantage of reduced power, better timing performance and lower area, while maintaining the self correcting benefit.

In some existing approaches the use of a single clock/reset input to a circuit was found to be the most significant common weakness in such designs. Accordingly, embodiments of the present disclosure provide numerous improvements to the MEU tolerance by adding in multiple clock inputs and resets/sets, each connected to a memory loop within the self-correcting flip flop. These inputs may be independently driven from their sources to improve the tolerance to MEU. Accordingly, each memory loop in the latch may include an individual reset input, set input or both, an individual clock input, and/or two Muller C element cells, one of which may be clock gated and a transmission gate.

In some embodiments, a value for N of three memory loops was found to be optimal for area and SEU tolerance. Better error tolerance may be achieved with a higher value of N, albeit with increased area, power and lower speed performance.

In some embodiments, and as discussed above, voting logic may be provided at the flip-flop output to ensure that only two of the three clocks and two of the three sets/resets should be functioning for the output to operate correctly. A single clock and a single reset into one memory loop may completely fail and the output may still operate correctly. For example, if a reset is intended, then two out of the three resets need to be active for the output to respond to the intended reset. Careful layout of the self-correcting flip-flop described herein may be needed to avoid contamination of an error across a majority of the interleaved memory loops, multiple clock inputs and reset/set inputs.

Embodiments included herein provide numerous advantages over existing approaches as the designs described herein may be far better than a standard flip-flop in rejecting SEU. In this way, if a large enough error does occur, the output corrects itself and the fault is not stored. If an improvement in functional safety was planned across a design, the most critical flip-flops with respect to fault tolerance may be identified. This subset of flip-flops may be replaced with self-correcting flip-flops to improve the overall fault rejection of the design with a limited increase in area. The current conventional implementation of applying TMR across the entire design will increase the sequential area by a factor of at least four and this design could still become faulty if an error occurs in two out of the three flip-flops in a TMR set. A standard latch has two back-to-back inverters in the memory loop, one of which is clock gated. However, embodiments of the present disclosure may include multiple Muller C element cells per memory loop. The smaller area self-correcting latch circuit embodiment shown in FIG. 4 improves the area and power dissipation with little cost to the simulation results of MEU tolerance when comparing it to the embodiment shown in FIG. 3.

Figure 5:
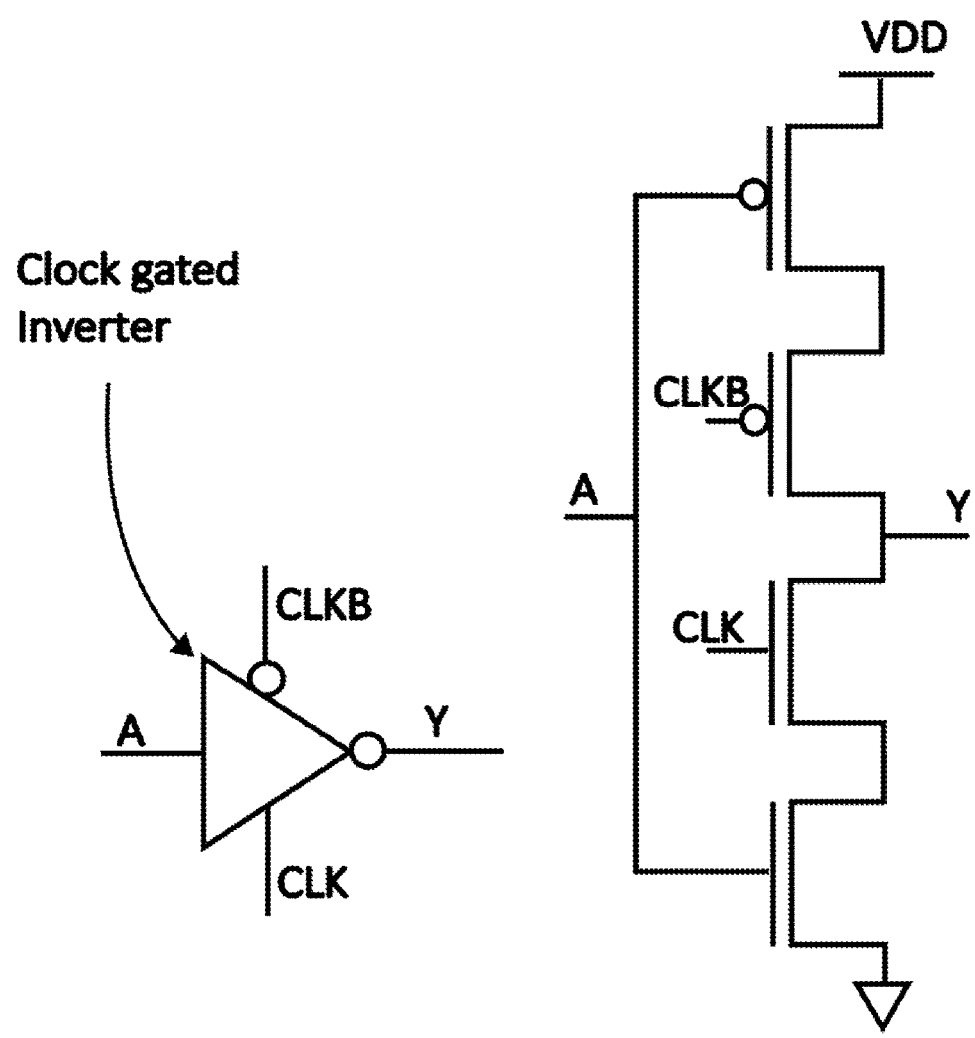
FIG. 5 shows an example clock gated inverter cell in accordance with embodiments of the present disclosure.
Figure 6:
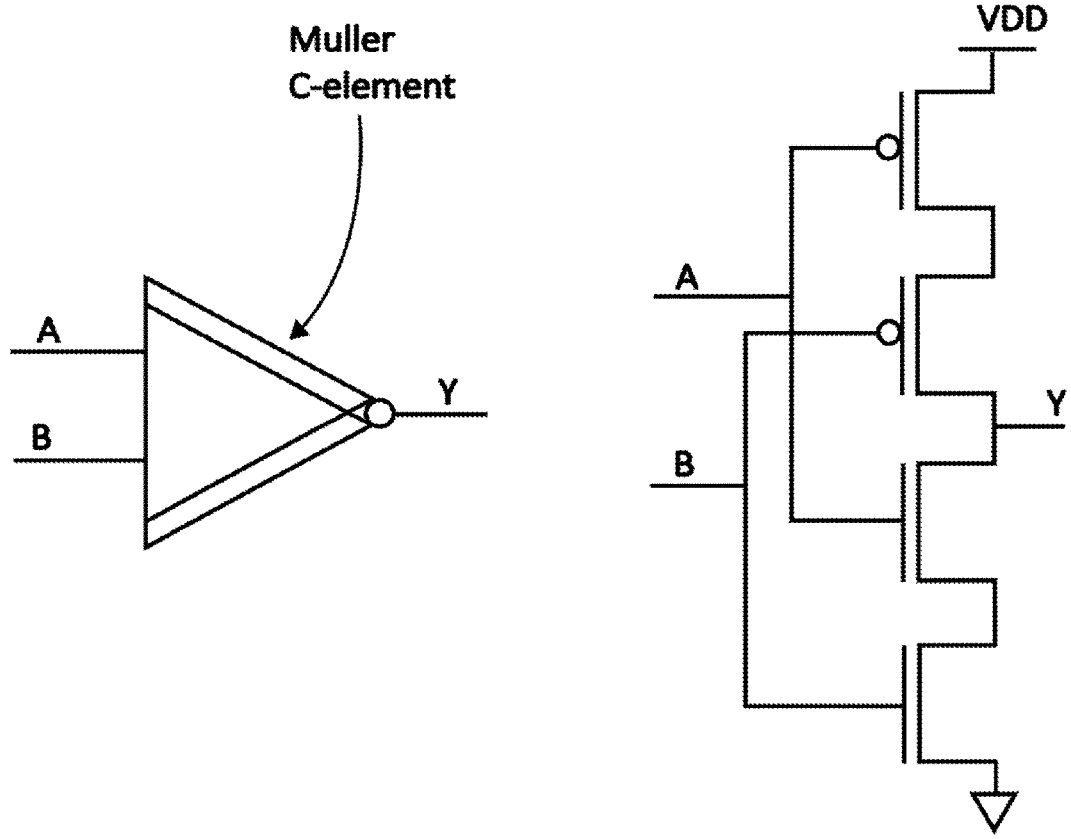
FIG. 6 shows an example Muller C element circuit in accordance with embodiments of the present disclosure.
Figure 7:
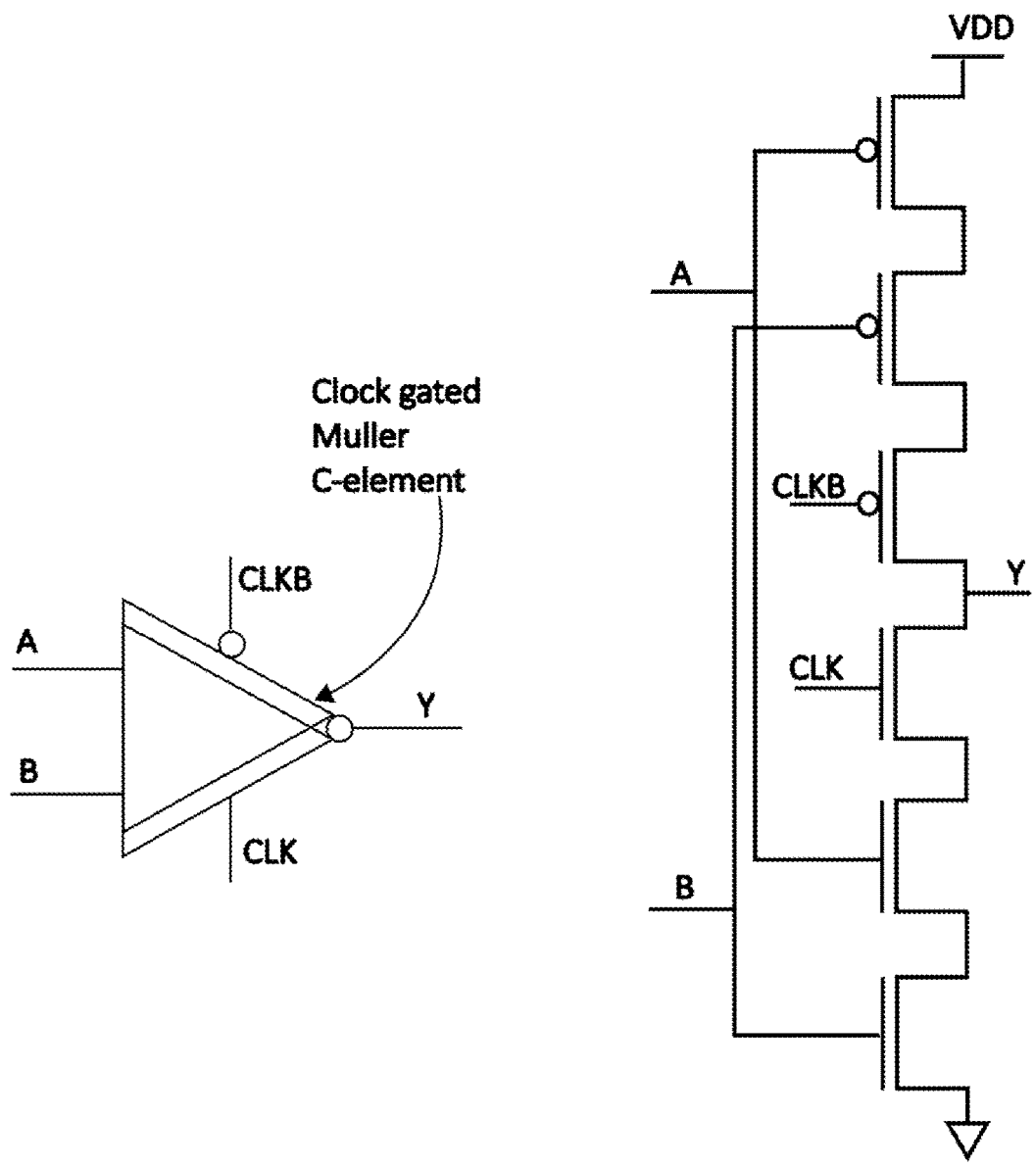
FIG. 7 shows an example clock gated Muller C element circuit in accordance with embodiments of the present disclosure.

Referring now to FIGS. 5-7, embodiments showing examples of various cells that may be used in the latch circuit are provided. FIG. 5 shows a clock gated inverter cell, FIG. 6 shows an example Muller C element, and FIG. 7 shows an example clock gated Muller C element. Each of these is discussed in further detail hereinbelow. The Muller C element shown in FIG. 6 behaves as an inverter if both inputs (A and B) are the same. If a SEU occurs on a single input of a Muller C elements, the two inputs will be different which will cause the output to be undriven and remain the same as previously driven before the SEU occurred.

In some embodiments, changing the flip-flop to have one clock/set/reset input would remove the advantage of rejecting errors on the individual clock/set/reset nodes but would still have the benefit of removing any errors within internal nodes of the self-correcting flip-flop. This example would be dependent on the drive strength of the clock tree to override any errors that occur to the clock nodes.

Figure 8:
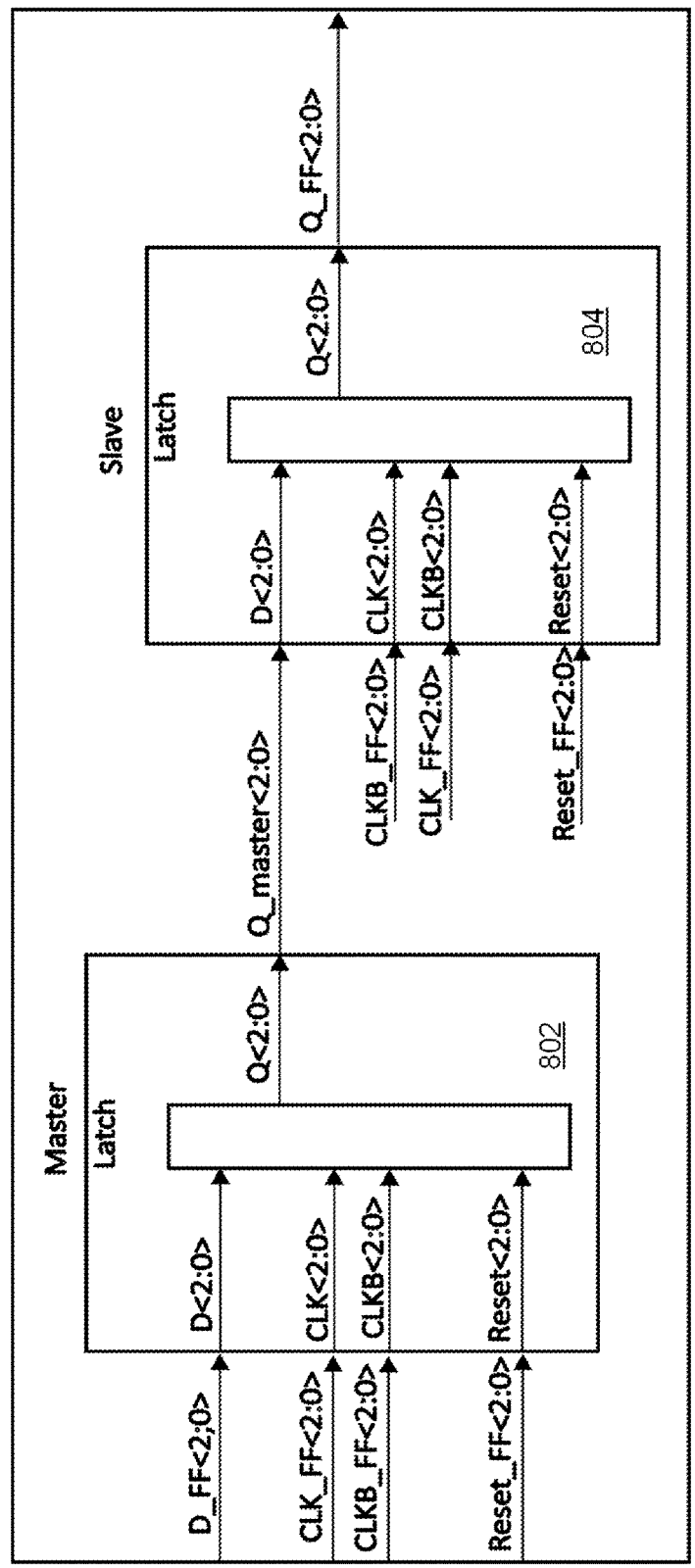
FIG. 8 shows an example master slave flip flop circuit in accordance with embodiments of the present disclosure.

Referring now to FIG. 8, a diagram 800 showing a circuit consistent with embodiments of the present disclosure is provided. Circuit 800 includes master latch 802 and slave latch 804. In this particular example, the circuit may include three inputs, three clocks and three outputs, all interleaved in the three memory loops of the self-correcting flip-flop. Here, a block of logic may be implemented in triple lockstep and the voting logic may be added to the end of a chain of logic, rather than having it at the output of each self-correcting flip-flop.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A circuit comprising:
a first self-correcting latch circuit including a plurality of memory loops, a plurality of clock inputs, a plurality of data inputs, and a plurality of outputs, wherein each of the plurality of memory loops is configured to store data in parallel, wherein the first self-correcting latch circuit includes voting logic configured to receive the plurality of outputs to reject any error in the plurality of memory loops, wherein the voting logic of the first self-correcting latch circuit is implemented in lockstep at the end of a logic chain.

2. The circuit of claim 1, wherein the first self-correcting latch circuit includes a plurality of resets.

3. The circuit of claim 1, wherein the first self-correcting latch circuit includes a plurality of sets.

4. The circuit of claim 1, wherein a single input is connected to each of the plurality of data inputs.

5. The circuit of claim 1, further comprising:
a second self-correcting latch circuit configured to generate a self-correcting flip-flop circuit wherein the first self-correcting latch circuit and the second self-correcting latch circuit each include a master latch and slave latch.

6. The circuit claim 1, wherein the plurality of memory loops includes at least one Muller C element.

7. The circuit of claim 1, wherein each memory loop of the plurality of memory loops is separated from one or more adjacent memory loops by a predetermined distance.

8. The circuit of claim 1, wherein the number of memory loops (N) included in the plurality of memory loops, the number of clock inputs (N) included in the plurality of clock inputs, the number of data inputs (N) included in the plurality of data inputs, and the number of outputs (N) included in the plurality of outputs are all greater than or equal to two, such that N≥2.

9. The circuit of claim 1, wherein the number of memory loops (N) included in the plurality of memory loops, the number of clock inputs (N) included in the plurality of clock inputs, the number of data inputs (N) included in the plurality of data inputs, and the number of outputs (N) included in the plurality of outputs are all equal to three, such that N=3.

10. The circuit of claim 2, wherein the number of clock inputs (N) included in the plurality of clock inputs and the number of resets (N) included in the plurality of resets is equal to three, such that N=3.

11. A circuit comprising:
a first self-correcting latch circuit including a plurality of memory loops, a plurality of clock inputs, a plurality of data inputs, a plurality of outputs, a plurality of resets, and a plurality of sets, wherein the latches are described as a master and slave latch, wherein each of the plurality of memory loops is configured to store the same data in parallel, wherein the first self-correcting latch circuit includes voting logic configured to receive the plurality of outputs to reject any error in the plurality of memory loops, wherein the voting logic of the first self-correcting latch circuit is implemented in lockstep at the end of a logic chain.

12. The circuit of claim 11, wherein the number of memory loops (N) included in the plurality of memory loops is equal to three, such that N=3.

13. The circuit of claim 11, wherein a single input is connected to each of the plurality of data inputs.

14. The circuit of claim 11, further comprising:
a second self-correcting latch circuit configured to generate a self-correcting flip-flop circuit wherein the first self-correcting latch circuit and the second self-correcting latch circuit each include a master latch and slave latch.

15. The circuit claim 11, wherein the plurality of memory loops includes at least one Muller C element.

16. The circuit of claim 11, wherein each memory loop of the plurality of memory loops is separated from one or more adjacent memory loops by a predetermined distance.

17. The circuit of claim 11, wherein the number of memory loops (N) included in the plurality of memory loops, the number of clock inputs (N) included in the plurality of clock inputs, the number of data inputs (N) included in the plurality of data inputs, and the number of outputs (N) included in the plurality of outputs are all greater than or equal to two, such that N≥2.

18. The circuit of claim 11, wherein the number of clock inputs (N) included in the plurality of clock inputs, the number of data inputs (N) included in the plurality of data inputs, and the number of outputs (N) included in the plurality of outputs are all equal to three, such that N=3.

* * * * *